United States Patent [19]

Jain

[11] Patent Number: 5,291,240
[45] Date of Patent: Mar. 1, 1994

[54] NONLINEARITY-COMPENSATED LARGE-AREA PATTERNING SYSTEM

[75] Inventor: Kanti Jain, Briarcliff Manor, N.Y.

[73] Assignee: Anvik Corporation, Elmsford, N.Y.

[21] Appl. No.: 967,189

[22] Filed: Oct. 27, 1992

[51] Int. Cl.$^5$ ............................................. G03B 27/42
[52] U.S. Cl. ......................................... 355/53; 355/77
[58] Field of Search ................. 355/50, 51, 53, 77; 250/492.2, 548

[56] References Cited

U.S. PATENT DOCUMENTS

| | | | |
|---|---|---|---|
| 3,819,265 | 6/1974 | Feldman et al. | 355/51 |
| 4,068,947 | 1/1978 | Buckley et al. | 355/72 |
| 4,171,870 | 10/1979 | Bruning et al. | 350/173 |
| 4,302,079 | 11/1981 | White | 350/371 |
| 4,362,384 | 12/1982 | Engelbrecht et al. | 355/71 |
| 4,701,608 | 10/1987 | Morita et al. | 250/205 |
| 4,748,477 | 5/1988 | Ishohata et al. | 355/53 |
| 4,749,867 | 6/1988 | Matsushita et al. | 250/442.1 |
| 4,758,091 | 7/1988 | Bodine | 356/358 |
| 4,778,233 | 10/1988 | Christenson et al. | 350/6.6 |
| 4,825,086 | 4/1989 | Mueller | 250/492.2 X |
| 4,879,605 | 11/1989 | Warkentin et al. | 358/296 |
| 4,901,109 | 2/1990 | Mitome et al. | 355/68 |
| 4,924,257 | 5/1990 | Jain | 355/53 |
| 4,962,318 | 10/1990 | Nishi | 250/548 |
| 5,227,839 | 7/1993 | Allen | 355/53 |

Primary Examiner—Richard A. Wintercorn
Attorney, Agent, or Firm—Carl C. Kling

[57] ABSTRACT

This patterning system has the ability to uniformly image a mask onto a substrate having nonlinear exposure characteristics, has large-area exposure capability, and comprises: (a) a stage system capable of synchronously scanning a mask and a substrate in one dimension, and when not scanning in that dimension, capable of moving them laterally in a direction perpendicular to the scan direction so as to position the mask and substrate for another scan partially overlapping the preceding scan, thus exposing the full substrate in an overlapping scan-and-repeat fashion; (b) an illumination system capable of illuminating on the mask a region of a predetermined multisided shape which has at least one of its sides curved, the curvatures of said curved sides being so determined that adjacent scanning exposures are compensated in their overlap regions for the nonlinear response characteristics of the substrate so as to provide uniform cumulative response; (c) a projection assembly capable of imaging the illuminated region on the mask onto the substrate, having the desired imaging resolution, and having an image field size smaller than the substrate; and (d) provision for adjusting the widths of the overlap regions of adjacent scans in such a way that the cumulative response over the entire substrate is uniform.

26 Claims, 6 Drawing Sheets

NONLINEARITY-COMPENSATED LARGE-AREA PATTERNING SYSTEM

BACKGROUND OF THE INVENTION

1. Field of the Invention

This invention relates to a large-area patterning system, and more particularly to a system for uniform, high-speed imaging of high-resolution patterns in radiation-sensitive media having nonlinear exposure-response characteristics for the production of high-performance electronic products with large areas, such as printed circuit boards, multichip modules, displays and semiconductor integrated circuits.

2. Description of Related Art

Economical manufacturing of many electronic and opto-electronic products requires fabrication of millions of microscopic structures on a single large substrate. The structures can be active devices, such as transistors in a nat-panel display (FPD) or a semiconductor integrated circuit (IC), or passive patterns such as interconnecting conductors in a printed circuit board (PCB) or a multichip module (MCM). The large substrate can be a board, a display panel or a silicon wafer. The pattern sizes in these diverse products range from sub-micron for semiconductor ICs to multi-microns for displays, MCMs and PCBs. The substrate size requirements vary from a few square inches for small modules to a few square feet for large PCBs and displays.

A critical and common factor in the above applications is that they all require a large-area patterning system that can provide the required resolution over the entire substrate. Cost-effective production requirements also prefer systems with high processing throughputs. The patterning technology selected determines not only the ultimate performance of the product, but also the economics of the entire manufacturing process through such key factors as throughput and yield. No pattering system currently exists that meets these criteria satisfactorily. The disclosed invention describes a system technology that delivers all of the desired performance and cost features in a patterning system, namely, large-area capability, high resolution, high throughput, and high yield.

There are three primary types of patterning systems currently in wide use:
contact printing systems,
projection imaging systems, and
focused-beam laser direct writing systems.

Contact printing suffers from two inherent disadvantages: generation of defects during patterning, and mask life degradation. A representative contact printer for volume manufacturing consists of a fixture to align and hold the substrate in contact with the mask, and a collimated high-intensity light source to flash expose the mask pattern onto the substrate. Such systems sometimes feature a two-drawer substrate handling facility, allowing the user to load a second substrate while a first is being exposed; double-sided drawers may allow exposure of opposite substrate sides simultaneously or sequentially. Most contact printers use mercury-xenon or metal-halide lamps, with powers ranging from 2 to 8 kW.

Conventional single-field projection imaging systems eliminate the disadvantages of contact printing resulting from defects and wear, but are limited in the largest substrate size they can expose due to their small image field. Step-and-repeat projection systems overcome this constraint by partitioning the substrate into several segments; however, this decreases throughput and creates the difficult requirement of precisely stitching the segments together. A representative single-field projection system uses a 1:1 magnification tens for imaging the mask pattern onto the substrate, a 1-2 kW mercury-xenon arc lamp, a heat-filtering mirror, and a condenser to direct the radiation to the mask. For different resolution requirements, the maximum image field of the projection lens is different. For example, whereas a 1-mil resolution can be obtained over a 4-inch square field, a 1-micron resolution must be limited to a field diameter of 2-3 cm. Step-and-repeat systems use reduction imaging, typically in the range 2:1-10:1. Generally, systems with larger reduction ratios provide higher resolution, but also lower throughput.

Laser direct writing systems, which write the pattern on the substrate with a focused scanning beam, suffer from an inherently slow speed due to their bit-by-bit, serial mode of addressing. A representative direct writing system uses a focused blue or ultraviolet laser beam in a raster scanning fashion to expose each pixel on the substrate. The focused spot is moved across the substrate in one dimension, while the stage holding the substrate is translated in the orthogonal dimension. Due to serial addressing, the processing times for direct-write systems are tong, ranging from a few minutes to a few hours per substrate, depending upon the resolution and complexity of the pattern data.

Thus, existing technologies for microelectronic patterning suffer from major shortcomings, including defect generation on substrate, mask wear, limitation of resolution or field size, and low throughput. Ideally, one desires the throughput of contact printers as well as the high resolution available from projection imaging and direct writing, without any of the disadvantages of the three technologies. There is thus a great need for developing a patterning system for fabrication of electronic products which combines three major performance attributes: high resolution, high processing throughput, and ability to handle large substrate sizes.

In my U.S. Pat. No. 4,924,257, Scan and Repeat High Resolution Lithography System, issued May 8, 1990 (appl. Ser. No. 253,717, filed Oct. 5, 1988), I have described an imaging technology which achieves the above objectives. The referenced patent discloses a patterning technology that uses synchronized mask and substrate stares which are moved in such a way that a large number of small image fields are joined together 'seamlessly' without any nonuniformly exposed overlaps or unexposed gaps. In my copending application, Large-Area, High-Throughput High-Resolution Projection Imaging System, appl. Ser. No. 954,662, filed Sep. 30, 1992, now U.S. Pat. No. 5,285,236 issued Feb. 8, 1994, I have disclosed a projection imaging system in which a single, integrated stage assembly for both mask and substrate and a non-reversing projection assembly are used to achieve high-throughput seamless patterning of large-area substrates. In this invention, I address imaging of substrates whose radiation-sensitive surfaces exhibit nonlinearities in their response to exposure to radiation. I disclose a large-area imaging system that includes a nonlinearity-compensated illumination system to provide uniform, seamless patterning of substrates having imaging surfaces that exhibit a variety of nonlinear exposure-response characteristics.

SUMMARY OF THE INVENTION

This invention provides a projection imaging system which can pattern very large microelectronic boards, display panels or semiconductor wafers (for ease of discussion the term 'substrate' will be used) at high production speeds and with high resolution. Light from a laser or lamp source is modified to provide an equal-intensity illumination beam of a specific shape across which the substrate is moved in a scan-and-repeat fashion to achieve uniform, seamless exposure over the entire substrate surface. The shaped illumination beam effectively scans the length of the substrate; the width of the substrate is covered by repeating many such scans. Adjacent scans are made to partially overlap—in such a way that in the overlap region the exposures from the two scans are complementary whose sum equals the exposure in the non-overlapping regions, leading to a uniform, seamless exposure of the whole substrate.

The patterning of the substrate takes place through image-wise exposure of its radiation-sensitive surface. The medium of the exposure region may be the substrate itself, or one or more layers of other materials deposited on it, such as photoresists. When the exposure medium is linear in its response to incident radiation, the ideal shape of the illumination beam in such an overlapping scan-and-repeat system is a hexagon. The intensities of two hexagon-shaped beams sweeping adjacent scans are complementary in the overlap region because they taper linearly in opposite directions. However, many patterning media used in microelectronics and other applications exhibit nonlinear radiation-response characteristics, good examples being polyimide and other dielectrics. In such media, the relative effect of exposure by two pulses of intensities 11 and 1, is not equal to the ratio $I_1/I_2$. Therefore, the overlap of two hexagonal beams will not lead to completely uniform and seamless exposure in the overlap region.

In this invention I disclose the concept of compensating for the nonlinearity of the patterning medium response by tailoring the shape of the illumination beam and optimizing the width of the overlap region, which result in great improvement in the uniformity and seamlessness of the exposure. Illumination beams in the shape of a 'polygonoid'—which is defined here as a generalized polygon in which some of the sides may be curved lines—are used to produce exposure levels from overlapping scans such that the net exposure in the overlap region is compensated for the effects of nonlinear radiation-response of the substrate surface.

The object of the invention is to provide a high-speed, high-resolution imaging system capable of uniformly exposing large substrates having nonlinear radiation-response characteristics.

A feature of the invention is a scan-and-repeat exposure mechanism which produces uniform, seamless exposure of the whole substrate by multiple scans which so overlap that exposures from adjacent scans in overlapping regions are compensated for response nonlinearity of the substrate.

Another feature of the invention is the provision of a polygonoid-shaped illumination beam such that the exposures in the overlapping region of adjacent scans are different from exact geometric complements of each other, and are compensated for nonlinear response of the substrate surface.

Another feature of the invention is the provision of means for adjusting the shape of the polygonoid beam so as to optimize it for the compensation of nonlinearities of different substrates.

Another feature of the invention is to adjust the width of the overlapping, region between adjacent scans to adjust the exposure levels so as to compensate for substrate nonlinearity.

Another feature of the invention is to adjust the beam intensity profile to optimize the exposure in the overlapping region between adjacent scans so as to compensate for substrate nonlinearity.

An advantage of the invention is the elegant simplicity of its optical and mechanical systems, resulting in a highly efficient, versatile, and economical patterning system.

Another advantage of the invention is its ability to pattern uniformly and seamlessly a wide variety of substrate materials with different nonlinear response characteristics.

Still another advantage of the invention is its ability to provide means for uniformly and seamlessly exposing different nonlinear materials in the same patterning system with adjustable controls for selecting the system parameters for different materials.

Other objects, features and advantages of the invention will be apparent from the following specification and from the annexed drawings and claims.

DETAILED DESCRIPTION OF THE PREFERRED EMBODIMENT

Figure 1:
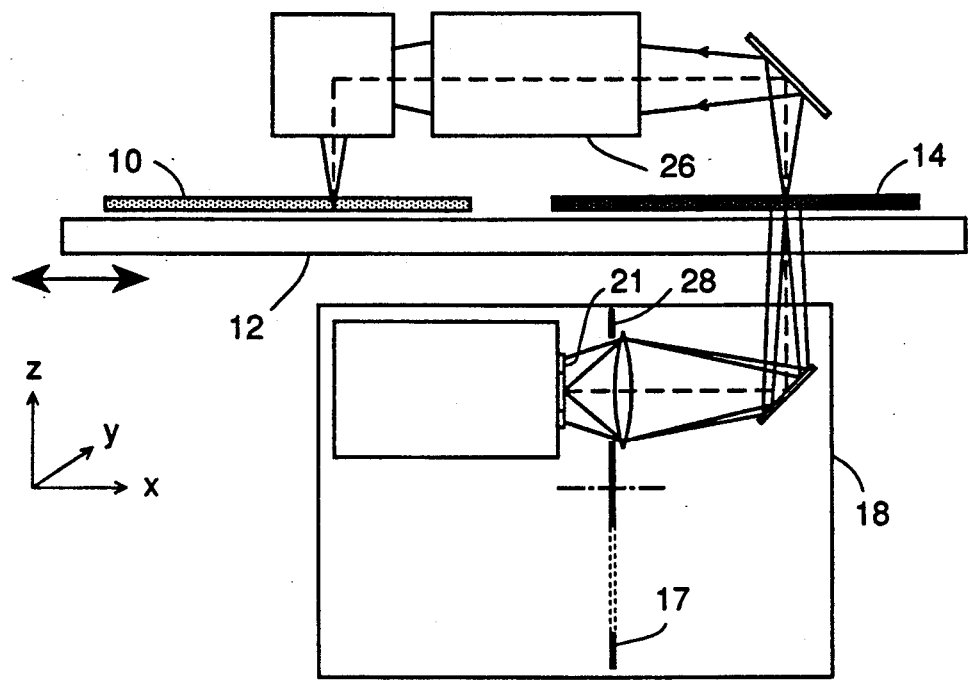
FIG. 1 is a composite illustration of the preferred embodiment of a nonlinearity-compensated large-area patterning system, showing a stage holding a mask and a substrate, a projection assembly, and an illumination system capable of providing beams of different shapes. The stage scans longitudinally in the x-direction and moves laterally along y between scans.

FIG. 1 illustrates a preferred embodiment of the new patterning system. The substrate 10 and mask 14 are held rigidly on a stage 12. The stage 12 is capable of scanning longitudinally in the x-direction (left-right) and moving laterally in the y-direction (perpendicular to the plane of the paper). The illumination system 18 is such that its effective emission plane 21, as determined by an aperture 28, is in a shape that I shall call a 'polygonoid', which is defined here as a generalized polygon in which some of the sides may be curved lines. Different polygonoid shapes may be selected by turning an aperture wheel 17. Details concerning the aperture wheel, a variety of polygonoidal shapes, and the reasons for using them will be described below. The radiation from the effective emission plane 21 is collected and directed on the mask 14. A 1:1 projection assembly 26 forms a precise image of the pattern contained within the illuminated polygonoidal region on the mask 14 onto the substrate 10. The optical path also includes additional optical means whose function is to cause the substrate image to have the same orientation as the mask pattern. I remark that a configuration similar to FIG. 1, but in which the effective emission plane 21 is in a fixed, regular hexagonal shape, has been previously described in my referenced copending application, Large-Area, High-Throughput, High-Resolution Projection Imaging, appl. Ser. No. 954,662 filed Sep. 30, 1992, now U.S. Pat. No. 5,285,236 issued Feb. 8, 1994.

The projection assembly 26 has a numerical aperture determined by the resolution requirements of the patterning system and is designed for as large a circular image field as possible. The illumination region on the mask (and therefore also the exposure region on the substrate) is then taken as the largest polygonoid of the desired shape that can be inscribed within the above circular field. The stage is scanned longitudinally in the x-direction so that the length of the mask traverses across its polygonoidal illumination region. This results in the substrate being simultaneously scanned across its polygonoidal exposure region. After completion of a scan, the stage moves laterally in the y-direction by an amount termed the 'effective scan width' (=w, defined below). Following such a lateral movement, a new scan in the x-dimension is generated as before, the stage is again moved along the y-direction by the scan width w, and the process is repeated until the entire substrate is exposed. Note that the illumination system 18 is stationary, as are the projection assembly 26 and other optical components.

The effective scan width w is the distance between the center lines of two adjacent scans, and is so designed that a certain region of overlap exists between the scans. A key feature of the scan-and-repeat patterning system disclosed in this invention is its ability to expose large areas uniformly by making the overlap region seamless. By specifying the shape of the polygonoidal illumination beam and the effective scan width w, the overlap is so selected that exposures from adjacent scans in the overlap region produce complementary responses in the substrate, thereby eliminating the appearance of any seam between the scans.

Figure 2:
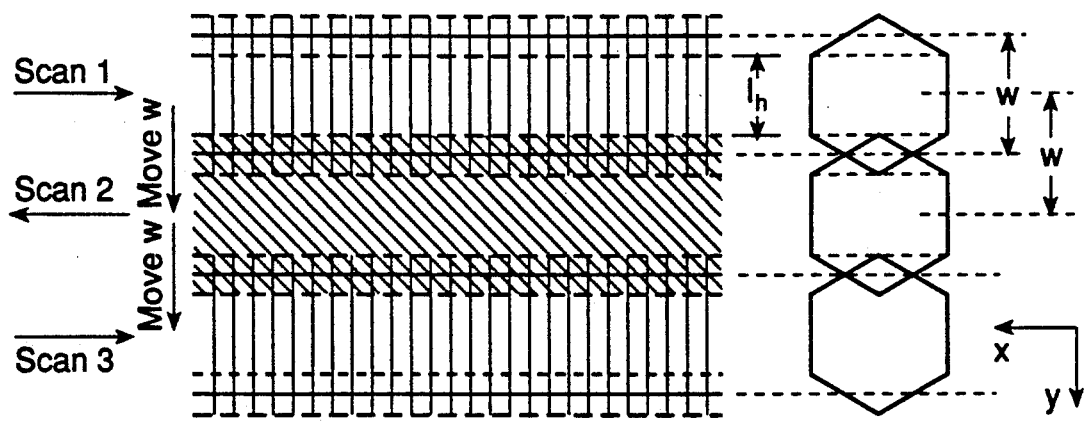
FIG. 2 illustrates the scan-and-repeat mechanism, showing three adjacent scans generated by overlapping hexagonal illumination beams and the complementary exposure in the overlap regions which produce seamless exposure in linear-response media.

The optimum overlap between adjacent scans depends upon the nature of the response that the substrate surface material exhibits to incident radiation. In my referenced U.S. Pat. No. 4,924,257, Scan and Repeat High Resolution Lithography System, issued May 8, 1990 (appl. Ser. No. 253,717, filed Oct. 5, 1988) and my copending application, Large-Area High-Throughput, High-Resolution Projection Imaging, appl. Ser. No. 454,662, filed Sep. 30, 1992, now U.S. Pat. No. 5,285,236 issued Feb. 8, 1994, I have described scan-and-repeat imaging systems that use a regular-hexagon-shaped illumination beam and an effective scan width (i.e., scan-to-scan separation) given by $w = 1.5\ l_h$, where $l_h$ is the length of each side of the hexagon (FIG. 2). This combination of beam shape and scan width produces a seamless cumulative response in the overlap region (of width $0.5\ l_h$) when the response of the substrate surface material to radiation is linear and the effects of two overlapping exposures add linearly, as is the case for most photoresists. However, there are many patterning applications in which the materials used exhibit nonlinear responses to incident radiation. In these situations, scanning with a hexagonal illumination beam and an overlap of 0.5 $l_h$ between adjacent scans will not produce a uniform, seamless cumulative exposure. A key feature of this invention is how, based upon the response characteristics of the nonlinear imaging medium, the optimum shape of the beam and the optimum separation between scans (i.e., the optimum overlap) can be determined that will produce the most uniform net response.

Figure 3:
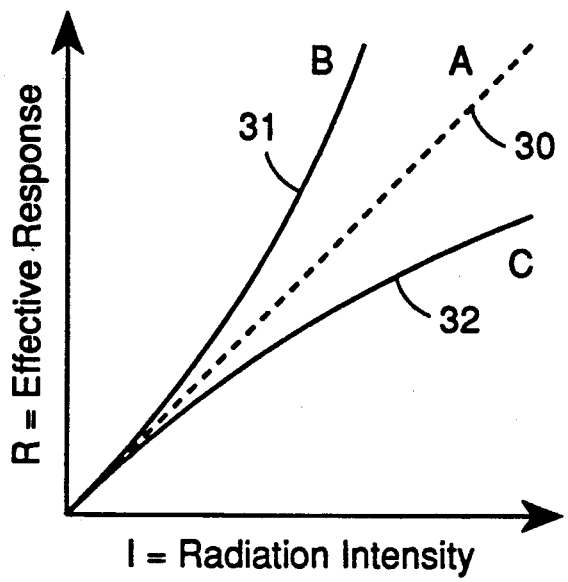
FIG. 3 is an illustration of different types of responses a material may exhibit as a function of illumination intensity: A indicates a linear response; B indicates a nonlinear response that increases faster than linearly; and C indicates a nonlinear response that increases slower than linearly.

FIG. 3 illustrates different types of nonlinearities of the effective response that a material may exhibit as a function of the incident radiation intensity. A linear response 30 is shown by the line A. The curve B (31) illustrates a nonlinearity by which the effective response increases faster than at a linear rate. A nonlinearity which causes the response to increase slower than at a linear rate is shown by the curve C (32).

Figure 4A:
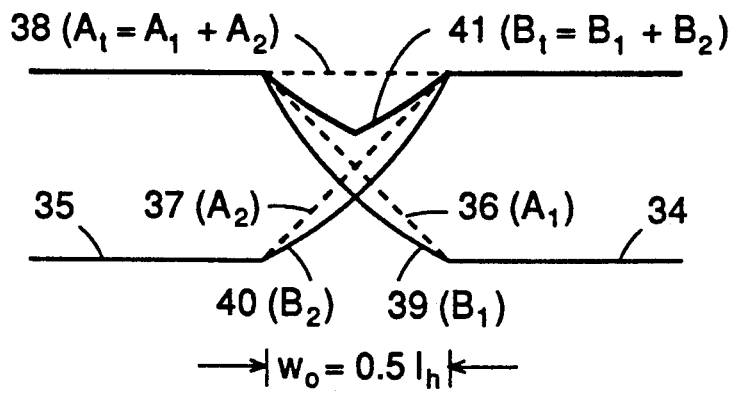
FIG. 4A shows how a nonlinear response of type B of FIG. 3 produces a highly nonuniform additive response in the overlap region of two adjacent scans carried out with a hexagonal beam. The width of the overlap region is $w_0 = 0.5\ 1_h$, where $1_h$ is the length of each side of the hexagon.
Figure 4B:
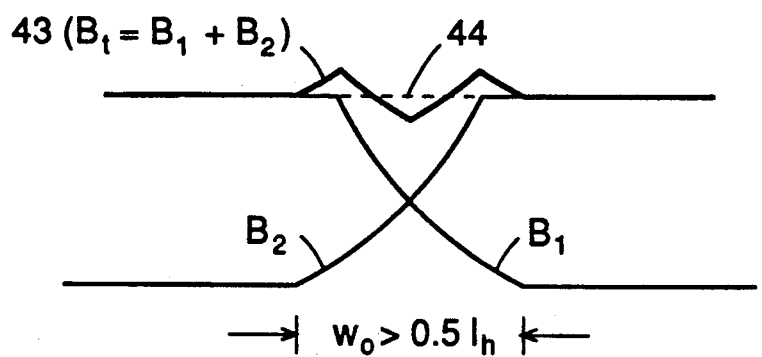
FIG. 4B illustrates how the uniformity of the cumulative response of FIG. 4A can be improved by increasing the width of the overlap region such that $w_0 > 0.5\ 1_h$.

In FIG. 4A I illustrate the exposure overlap when the substrate surface material has a nonlinear response of type B (31 in FIG. 3). I have used (as in FIG. 2) a regular-hexagon-shaped illumination beam and a scan width of $w = 1.5 \, l_h$, where $l_h$ is the length of each side of the hexagon. The figure shows the exposure profiles from two adjacent scans 34 and 35 with an overlap region of width $w_0 = 0.5 \, l_h$. The dotted lines 36 ($A_1$) and 37 ($A_2$) indicate what the exposure profiles would be if the substrate surface material had a linear response of type A (30) of FIG. 3. The sum of the linear responses 36 ($A_1$) and 37 ($A_2$) is shown by 38 ($A_1 = A_1 + A_2$), which, as indicated in the figure, results in a uniform, seamless exposure across the overlap region. But for nonlinear responses 39 ($B_1$) and 40 ($B_2$), the sum 41 ($B_1 = B_1 + B_2$) is highly nonuniform. The effective cumulative response in the overlap region can be made more uniform by bringing the scans closer, i.e., by making the overlap width $w_0 > 0.5 \, l_h$, as shown in FIG. 4B. Here, the deviation of the cumulative exposure 43 ($B_1$) from a straight line 44 (i.e., a perfectly uniform response) is less than the deviation of 41 from 38 in FIG. 4A.

Figure 5A:
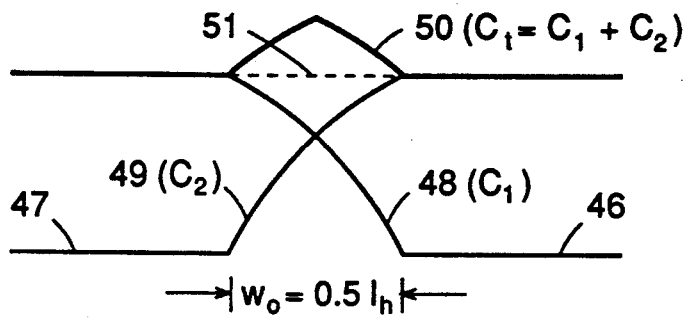
FIG. 5A shows how a nonlinear response of type C of FIG. 3 produces a highly nonuniform additive response in the overlap region of two adjacent scans carried out with a hexagonal beam. The width of the overlap region is $w_0 = 0.5\ 1_h$, where $1_h$ is the length of each side of the hexagon.
Figure 5B:
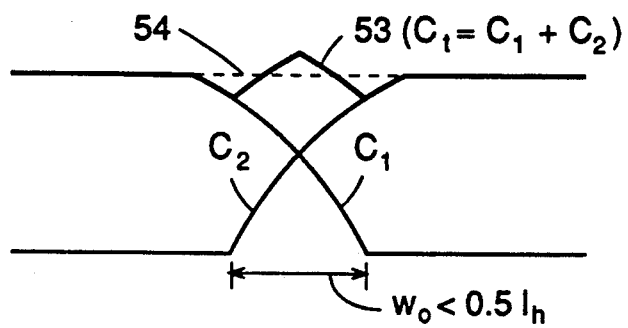
FIG. 5B illustrates how the uniformity of the cumulative response of FIG. 5A can be improved by decreasing the width of the overlap region such that $w_0 < 0.5\ 1_h$.

FIG. 5A illustrates the exposure overlap when the substrate surface material has a nonlinear response of type C (32 in FIG. 3). The exposure profiles from two adjacent scans are indicated as 46 and 47. In the overlap region of width $w_0 = 0.5 \, l_h$, the nonlinear responses are shown as 48 ($C_1$) and 49 ($C_2$). The cumulative exposure in the overlap region is indicated by the sum 50 ($C_1 = C_1 + C_2$), which, as shown, is highly nonuniform and deviates significantly from the ideal response 51. The effective net response in the overlap region can be made more uniform by decreasing the overlap width ($w_0 < 0.5 \, l_h$). Now, as shown in FIG. 5B, the deviation of the cumulative exposure 53 ($C_1$) from a straight line 54 (i.e., a perfectly uniform response) is less than the deviation of 50 from 51 in FIG. 5A.

Figure 6A:
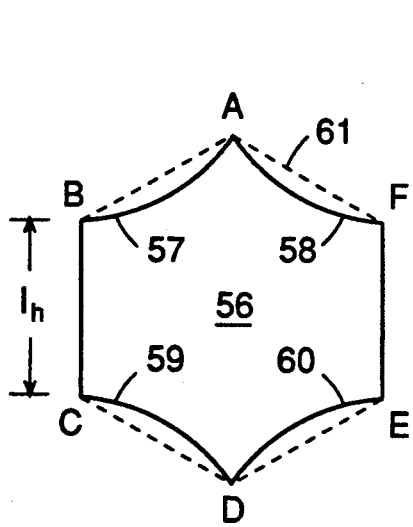
FIG. 6A is the cross-section of an illumination beam in the shape of a 'polygonoid', which is defined here as a generalized polygon in which one or more lines can be curved lines. In this example, four sides of the polygonoid are curved, with their curvatures convex toward the center.

Above I have described scan-and-repeat patterning in which the shape of the illumination beam is hexagonal and in which the width of the overlap region between adjacent scans is so adjusted that the uniformity of the cumulative response in the overlap region is optimized. I now describe scan-and-repeat seamless patterning, using a 'polygonoid'-shaped illumination beam by which a perfectly uniform cumulative response can be obtained. I define here a polygonoid as a shape which can be considered a generalized polgon, i.e., in which one or more sides can be curved rather than straight lines. FIG. 6A shows an example of a six-sided polygonoid, 56, in which four sides (57,58,59,60) are curved, with their curvatures being convex toward the center of the polygonoid. Note that the six vertices (A,B,C,D,E,F) of the polygonoid fall on the vertex sites of a regular hexagon (61) in which the length of each side is $l_h$ and which can be inscribed within the circular field of the projection assembly 26 (FIG. 1). The curvatures of the sides 57, 58, 59 and 60 are so chosen that overlapping scanning exposures by adjacent scans are compensated for the response nonlinearity of the substrate surface material, as explained below.

Figure 6B:
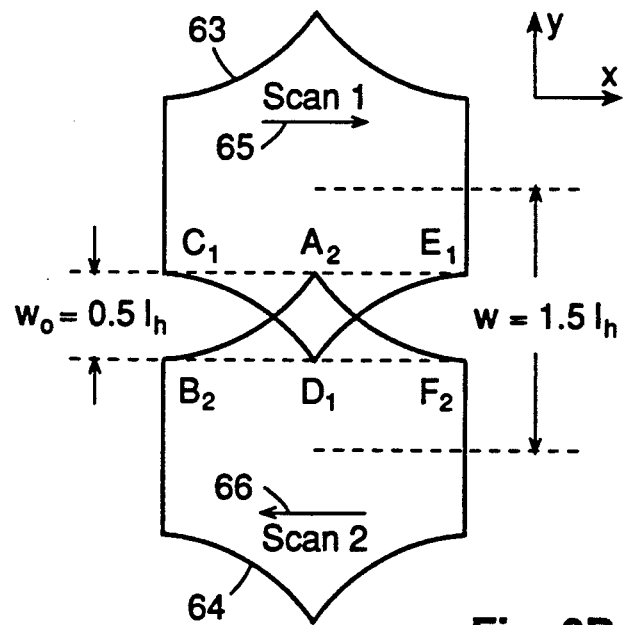
FIG. 6B illustrates scan-and-repeat exposure using a beam shape of FIG. 6A which produces a seamless response in a material with a nonlinearity of type B of FIG. 3. The width of the overlap region is $w_0 = 0.5\ l_h$, where $l_h$ = length of a side of the hexagon circumscribing the polygonoid.

Overlapping seamless scan-and-repeat exposures are performed using the polygonoid-shaped illumination beam of FIG. 6A and are described with reference to FIG. 6B. Adjacent scans (65,66) in the x-dimension are swept by beams indicated by polygonoids 63 and 64, which are separated in the y-dimension by $w = 1.5 \, l_h$, the width of the overlap region thus being $w_0 = 0.5 \, l_h$. In FIG. 6B, note that the portion of the first scan (65) exposed by the segment $C_1D_1E_1$ of polygonoid 63 is overlapped by the portion of the second scan (66) exposed by the segment $B_2A_2F_2$ of polygonoid 64. In the polygonoid considered in this example, the curvatures shown for sides 57, 58, 59 and 60 (FIG. 6A) are chosen for a nonlinearity of type B (FIG. 3). For polygonoid 63, going in the y-direction from point $D_1$ to $A_2$ in the overlap region, whereas the nonlinearity of the substrate surface material produces a response that increases faster than linearly with exposure intensity, the exposure intensity increases slower than linearly. By suitably tailoring the curvatures of sides $C_1D_1$ and $E_1D_1$, the response is made to increase linearly in the $+y$ direction as y goes from $D_1$ to $A_2$. Similarly, for polygonoid 64, the response is made to increase linearly in the $-y$ direction as y goes from $A_2$ to $D_1$. Since the overlap width $w_0 = 0.5 \, l_h$ is such that point $A_2$ lies on line $C_1E_1$ and point $D_1$ lies on line $B_2F_2$, and since the responses from polygonoids 63 and 64 taper linearly to zero in opposite directions, the net effect of the overlapping scans is a perfectly uniform, seamless exposure of the substrate.

Figure 7A:
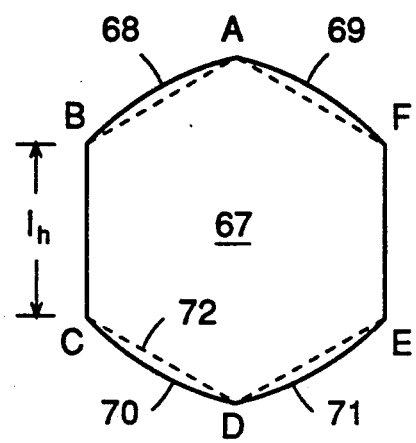
FIG. 7A is the cross-section of an illumination beam in the shape of a polygonoid in which four sides of the polygonoid are curved and their curvatures are concave toward the center.
Figure 7B:
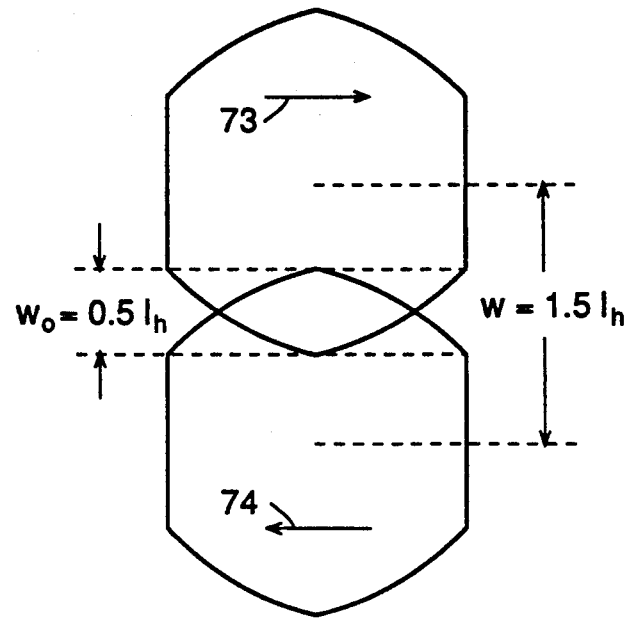
FIG. 7B illustrates scan-and-repeat exposure using a beam shape of FIG. 7A which produces a seamless response in a material with a nonlinearity of type C of FIG. 3.

In FIG. 7A we show an example of a polygonoid (67) which is designed to compensate for a nonlinearity of type C (FIG. 3). The curved sides are 68, 69, 70 and 71, and have their curvatures concave toward the center. The vertices (A,B,C,D,E,F) of the polygonoid (67) still occupy the vertex sites of a regular hexagon (72). Scanning exposures (73,74) are carried out with an overlap width of $w_0 = 0.5 \, l_h$ (FIG. 7B). The curvatures of the curved sides (68,69,70,71) are tailored to compensate for the type-C (FIG. 3) nonlinear response of the substrate surface material, producing a uniform, seamless exposure of the entire substrate.

Figure 8A:
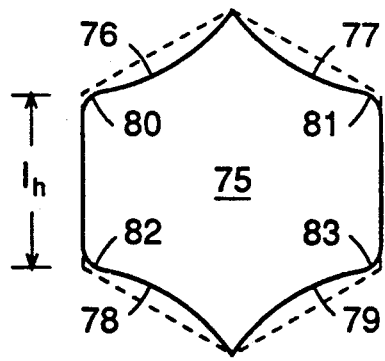
FIG. 8A is the cross-section of an illumination beam of a polygonoidal shape similar to that of FIG. 6A but in which some corners have been rounded to further optimize it for uniform exposure.
Figure 8B:
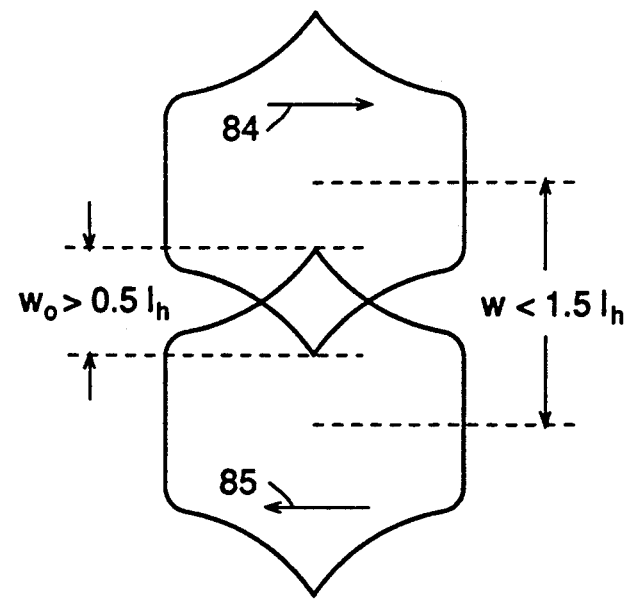
FIG. 8B illustrates scan-and-repeat exposure using an illumination beam in the shape of the polygonoid of FIG. 8A in which the optimized width of the overlap region between adjacent scans is $w_0 > 0.5\ l_h$, where $l_h$ is the length of each side of the hexagon that circumscribes the polygonoid.

Additional flexibility and refinement in making the cumulative exposure uniform and seamless is made possible by rounding some of the corners of the polygonoidal shape of the illumination beam and by optimizing both the curvatures of its curved sides and the width of the overlap between adjacent scans. FIG. 8A shows a polygonoid 75 whose sides 76, 77, 78 and 79 are curved and whose corners 80, 81, 82 and 83 have been rounded. FIG. 8B illustrates two overlapping scans (84,85) using the illumination beam shape of FIG. 8A. Here, the center-to center distance between the scans, w, is shown to be $< 1.5 \, l_h$ and the width of the overlap region, $w_0$, to be $> 0.5 \, l_h$; these value are determined by optimizing the overlap width in conjunction with the curvatures of the sides 76, 77, 78 and 79 and the rounding of the corners 80, 81, 82 and 83 so as to achieve the best uniformity of cumulative response to exposures in the overlap region.

Figure 9:
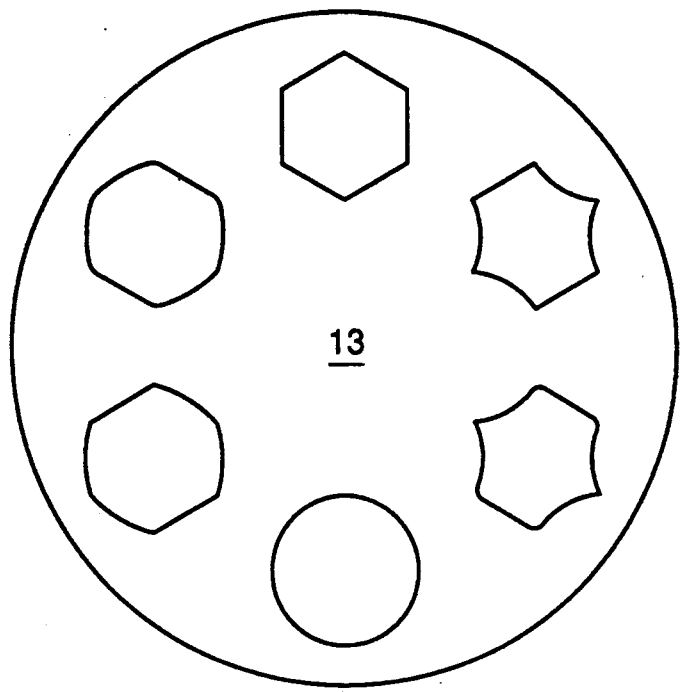
FIG. 9 is a diagram of an aperture wheel which permits selection of the optimum beam profile from several choices for uniform exposure of materials with different response characteristics.

To optimize the shape of the illumination polygonoid, one first determines the nature of the response nonlinearity of the substrate surface material by plotting its exposure response as a function of incident illumination intensity. Knowing the nonlinearity, one then calculates what the optimum curvature of the curved sides of the polygonoid must be so that in the overlapping region the response from each scan decreases linearly to zero in a direction perpendicular to the scan direction. Having thus defined the ideal shape of the polygonoid, one must now produce an illumination beam of such shape. This is done by placing an aperture of the defined shape within the illumination system, as shown by 28 in FIG. 1. The patterning system can be readily optimized for exposing different materials having different nonlinearities by changing from one aperture to another; an effective way to accomplish this is to incorporate in the illumination system an aperture wheel containing different shapes which have been predesigned for the materials that will be exposed by the patterning system. An example of an aperture wheel (17) is shown in FIG. 9, which contains four different polygonoids for optimum exposure of materials with different nonlinear responses, a hexagonal aperture for linear-response materials, and a circular aperture for system calibration purposes.

Figure 10A:
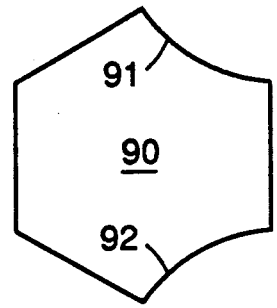
FIGS. 10A and 10B illustrate polygonoidal illumination beam shapes in which the number of curved sides is, respectively, two and one.
Figure 10B:
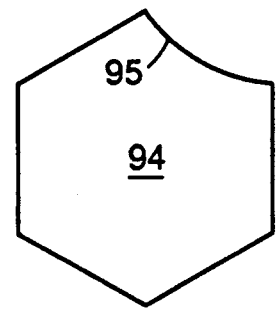

In FIGS. 6A and 7A, I have shown polygonoids in which four of the six sides are curved. In other embodiments, one may use shapes having less than four curved sides and still provide nonlinearity compensation as desired. FIG. 10A illustrates an example of a shape (90) with two curved sides (91,92). A polygonoid (94) with only one curved side (95) is shown in FIG. 10B. Clearly, the optimum curvature(s) of the curved side(s) will depend on the number of such sides in the shape.

Figure 11A:
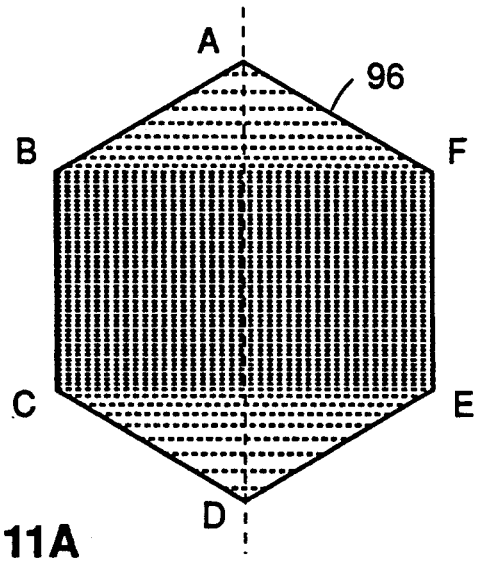
FIG. 11A shows a hexagonal beam in which the illumination intensity is designed to vary along the y-direction such that the exposure is compensated for substrate nonlinearity.
Figure 11B:
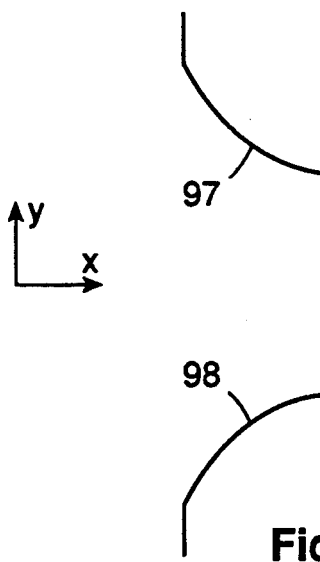
FIG. 11B illustrates the intensity profile along the y-direction for the beam of FIG. 11A.

I remark that in all of the shapes illustrated in FIGS. 6-10, the curved sides of the polygonoid are responsible for providing the uniformity of the exposure, because, when scanned with an illumination beam of one of these shapes, the integrated dose delivered in the overlap region at any point as a function of its position along the transverse direction (i.e., perpendicular to the scan direction) is tailored to compensate for the nonlinearity of the substrate response. An alternative technique to provide the required variation of the dose is to tailor the intensity profile within a regular-hexagonal beam shape without curving any sides. FIG. 11A presents an example of such an embodiment. The shape of the illumination beam is illustrated by the regular hexagon 96. The intensity of radiation within the hexagon is indicated by the density of dots in the figure; thus, in the overlap region ABF or CDE, as one goes toward the vertex A or D, the intensity decreases. The variation of the intensity profile in the y-direction is shown in FIG. 11B. Therefore, by suitably tailoring the portions 97 and 98 of this profile, the desired compensation for any substrate nonlinearity can be obtained. A convenient technique for intensity profiling consists in using a mechanical attenuator in which opaque dots are varied in size or density, as in half-toning, to provide graded intensity. Alternatively, the attenuation may be obtained optically, e.g. by using a neutral density filter or by rearranging the rays within the overlap region by geometrical optics.

Figure 12:
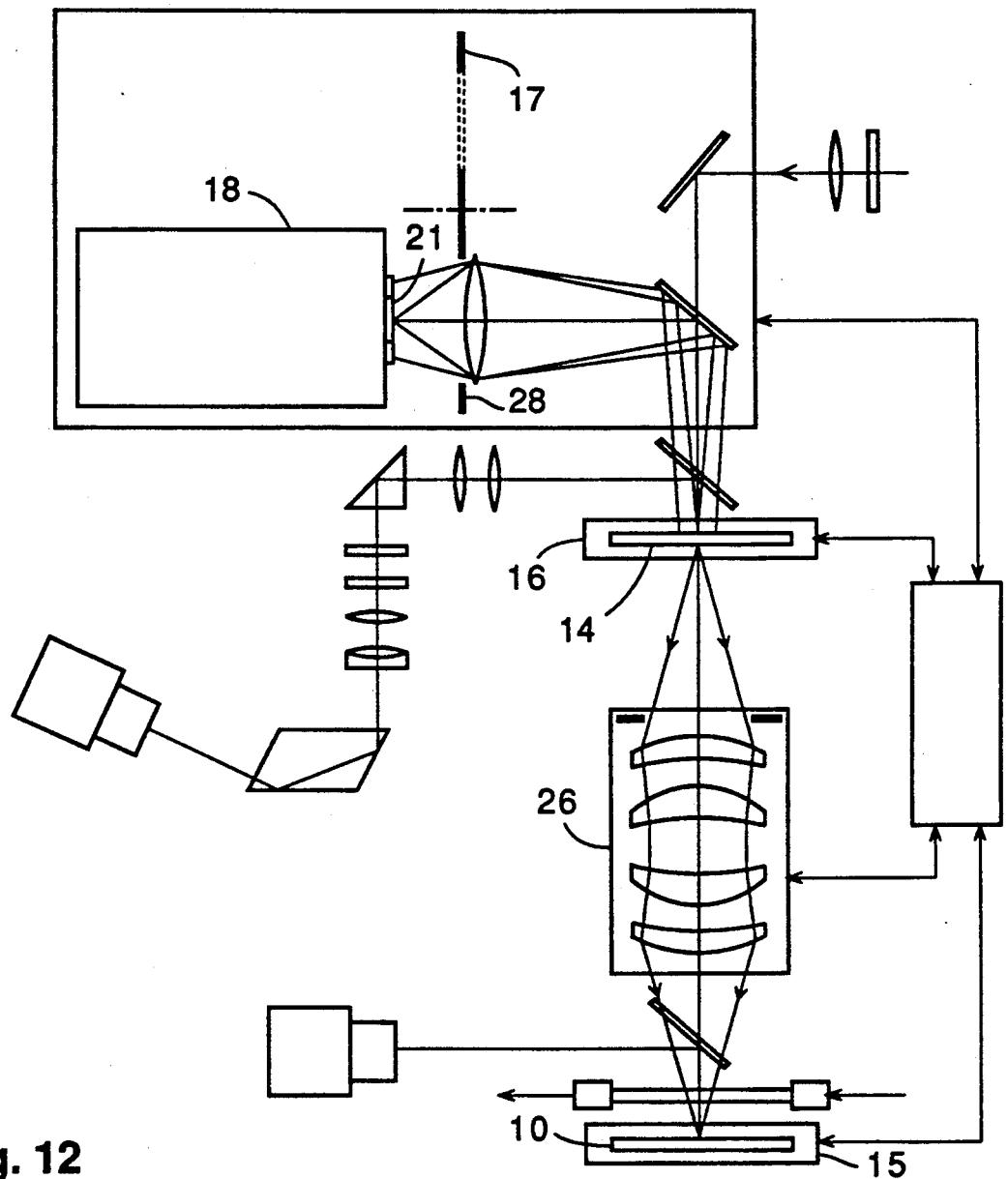
FIG. 12 illustrates an embodiment of the nonlinearity-compensated scan-and-repeat patterning system in which the mask-to-substrate imaging ratio is 1:R. The mask and substrate are mounted on separate stages which scan at speeds related by the ratio 1:R. The illumination system includes an aperture wheel containing different shapes to compensate for different substrate nonlinearities.

The system embodiment shown in FIG. 1 uses a single stage (12) for the mask (14) and substrate (10). The advantage of such a configuration is its mechanical and optical simplicity. However, since the mask and substrate are rigidly mounted on the same stage, the single-stage embodiment requires that the imaging ratio of the projection assembly be 1:1. For certain applications, such as patterning very large substrates, 1:1 imaging will demand equally large masks. In such a situation, a 1:M (where M>1) magnification system may be more desirable. For imaging very high-resolution patterns on small substrates, an N:1 (where N<1) reduction imaging may be preferable. For many such patterning applications that favor imaging ratios other than 1:1, the embodiment shown in FIG. 12 may be attractive. Here, the mask (14) and substrate (10) are mounted on separate stages (16,15) whose movements are synchronized, preferably electronically. The scanning speeds of the two stages are in the ratio 1:r, where r is the mask-to-substrate image magnification or reduction ratio. The other details of scanning and overlapping adjacent scans are similar to those for the embodiment of FIG. 1. Also, as in FIG. 1, the embodiment of FIG. 12 includes an illumination system 18 whose effective emission plane 21, as determined by an aperture 28, is in the shape of a polygonoid designed for optimum compensation of the nonlinear response of the substrate surface material so as to produce uniform, seamless response on the entire substrate. The patterning system is readily optimized for exposing different materials having different nonlinearities by changing from one aperture to another. As in FIG. 1, this is made possible with an aperture wheel 17 having several polygonoidal shapes which have been predesigned for the materials that will be exposed by the patterning system. I remark that a configuration similar to FIG. 12, but in which the effective source emission plane 21 is in a fixed, regular hexagonal shape (ideal for exposing linear-response media), has been previously described in my referenced U.S. Pat. No. 4,924,257, Scan and Repeat High Resolution Lithography System, issued May 8, 1990 (appl. Ser. No. 253,717, filed Oct. 5, 1988).

Although in the description of the invention presented above the illumination system has been understood to have an optical source, I remark that alternative embodiments may use X-ray or electron-beam radiation for patterning. It is known that many imaging media sensitive to X-rays and electron beams exhibit nonlinearities in their response to the incident intensity. The disclosed invention will therefore be applicable to X-ray and electron-beam patterning systems in which it is desired to compensate the exposures in overlapping scans for the response nonlinearity of the substrate material to obtain a uniform cumulative response. For X-rays, the projection assembly (26) will consist of suitable X-ray optics; alternatively, the imaging may take the form of shadow printing, employing a proximity configuration without a lens. The latter configuration will also be desirable for an electron-beam patterning system.

METHOD OF OPERATION

The invention describes a method of providing a large-area scan-and-repeat patterning system for uniformly exposing substrates with nonlinear response characteristics, using the following steps:

1. Providing a stage system for synchronously moving a mask and a substrate at speeds in a certain ratio 1:R, the movements being longitudinal scanning in one direction, and lateral shifting in a direction perpendicular to the scan direction;

2. Providing a projection assembly of imaging ratio 1:R, which is designed to produce a 1:R image of an illuminated region of the mask on the substrate, and has a circular image field size which may be substantially smaller than the size of the substrate;

3. Determining the nonlinear response characteristics of the substrate material at different values of exposure radiation intensity;

4. Providing an illumination system which produces on the mask an illumination region which can be inscribed within the circular field of the projection assembly of step 2, the illumination region being of a multisided shape in which some of the sides may be curved, and the shape being determined by the nonlinear response characteristics determined in step 3 in such a way that overlapping scanning exposures (as described in steps 5 and 6 below) are compensated for the substrate nonlinearity and result in uniform cumulative response;

5. Scanning the mask and substrate stage system longitudinally so that the length of the mask traverses across the multisided illumination region described in step 4;

6. Stopping the stage system momentarily after completion of a scan across the length of the mask, moving the stage system by a certain distance w in a direction perpendicular to the scan direction, and resuming the longitudinal scanning in a direction opposite to the scan direction in step 5, the distance w being determined in conjunction with the multisided shape so as provide uniform cumulative response in the overlap region; and 7. Repeating steps 5 and 6 until exposure of the entire substrate is completed.

For additional precision in patterning, the method of operation may further include the step of periodically realigning the mask with respect to the substrate during the steps 5-7 above.

While the invention has been shown preferably through the embodiments illustrated in FIGS. 1-10, it will be clear to those skilled in the art that the modifications described as alternatives, and other alternatives, may be pursued without departing from the spirit and scope of the invention, as defined in the following claims.

What is claimed is:

1. A large-area, high-throughput, high-resolution, scan-and-repeat patterning system for uniformly imaging a mask onto a substrate having nonlinear response characteristics, characterized by
    (a) a stage system (12/(15,16)) capable of synchronously moving a mask (14) and a substrate (10) at speeds in a certain ratio 1:R; said movements being scanning in one dimension, and when not scanning in that dimension, shifting laterally in a direction perpendicular to the scan direction so as to position said mask and substrate for another scan partially overlapping with the preceding scan; said stage system thus being capable of exposing the full substrate by breaking up the substrate area into a certain number of parallel strips and exposing each strip by scanning the length of the strip across a fixed illumination region;
    (b) an illumination system (18) having the wavelength and intensity distribution characteristics suited for exposure of said substrate (10); having an effective source plane of a predetermined multisided shape (56/67/75); capable of illuminating a region of said shape on said mask (14); said predetermined multisided shape having at least one of its sides curved, and the curvatures of said curved sides being so determined that adjacent scanning exposures ((65,66)/(73,74)/(84,85)) are compensated in their overlap regions for the nonlinear response characteristics of said substrate (10) so as to provide uniform cumulative response;
    (c) a projection assembly (26) for imaging said illuminated region of said predetermined multisided shape on the mask onto the substrate; having a mask-to-substrate imaging ratio of 1:R; having the desired imaging resolution; and having an image field of an area smaller than the substrate area; and
    (d) control means to operatively interrelate said stage system (12/(15,16)), said illumination system (18) and said projection system (26) to determine the width of said overlap regions of adjacent scans and to provide additive illumination in said overlap regions such that the effect of the exposure dose delivered in said overlap regions is seamless and the effect of the exposure dose delivered across the entire substrate is uniform.

2. A patterning system according to claim 1, further characterized in that two sides of said predetermined multisided shape of the effective emission plane of said illumination system (18) are straight lines, and the region of said shape illuminated on the mask (14) is so oriented that said straight sides of the shape are perpendicular to the scan direction.

3. A patterning system according to claim 1, further characterized in that said predetermined multisided shape of the effective emission plane of said illumination system (18) is such that its vertices substantially occupy the vertex sites of a regular hexagon (61/72).

4. A patterning system according to claim 3, further characterized in that the effective width, w, of each scan, as defined by the lateral separation between the center lines of two adjacent scans ((65,66)/(73,74)), is given by $$w = 1.5\ l_h,$$

where $l_h$ is the length of each side of said regular hexagon (61/72).

5. A patterning system according to claim 1, further characterized in that the curvatures of said curved sides of said predetermined multisided shape of the effective emission plane of said illumination system (18) are convex toward the center of said shape.

6. A patterning system according to claim 1, further characterized in that the curvatures of said curved sides of said predetermined multisided shape of the effective emission plane of said illumination system (18) are concave toward the center of said shape.

7. A patterning system according to claim 1, further characterized in that at least one of the corners of said predetermined multisided shape of the effective emission plane of said illumination system (18) is rounded.

8. A patterning system according to claim 1, further characterized in that said illumination subsystem (18) provides radiation from a mercury lamp.

9. A patterning system according to claim 1, further characterized in that said illumination subsystem (18)

provides radiation that is pulsed with a certain repetition frequency.

10. A pattering system according to claim 9, further characterized in that said pulsed radiation is emitted by an excimer laser.

11. A pattering system according to claim 1, further characterized in that said illumination subsystem (18) provides radiation from a carbon-dioxide laser.

12. A pattering system according to claim 1, further characterized in that said illumination subsystem (18) provides radiation from a neodymium laser.

13. A pattering system according to claim 1, further characterized in that said illumination subsystem (18) provides X-ray illumination of a region of said predetermined shape on said mask (14).

14. A pattering system according to claim 1, further characterized in that said illumination subsystem (18) provides electron-beam illumination of a region of said predetermined shape on said mask (14).

15. A pattering system according to claim 1, further characterized in that
   (a) said mask (14) and substrate (10) are mounted on a single stage system (12), the ratio of the speeds of their movements thus being 1:1; and
   (b) said projection assembly (26) has a mask-to-substrate imaging ratio of 1:1, and includes means to render the image on the substrate in the same orientation as the pattern on the mask.

16. A patterning system according to claim 1, further characterized in that
   (a) said stage system consists of two separate stages a first stage (16) for mounting said mask (14) and a second stage (15) for mounting said substrate (10); the ratio of the speeds of said mask stage (16) and substrate stage (15) is 1:r, where r is a number other than unity; and the mask stage and substrate stage are synchronized to move at speeds in the ratio 1:r; and
   (b) said projection assembly (26) has a mask-to-substrate imaging ratio of 1:r.

17. A patterning system according to claim 1, further characterized in that said illumination system (18) includes means (17) containing multiple predetermined multisided shapes, means for selecting any one of said multiple shapes, and means for producing the effective source plane of the illumination system in said selected shape, the illumination system thus being capable of providing optimum nonlinearity-compensation for uniform response in exposure of different substrate materials with different nonlinearities.

18. A large-area, high-throughput, high-resolution, scan-and-repeat patterning system for uniformly imaging a mask onto a substrate having nonlinear response characteristics, characterized by
   (a) a stage system (12/(15,16)) capable of synchronously moving a mask (14) and a substrate (10) at speeds in a certain ratio 1:R; the movements being scanning in one dimension, and when not scanning in that dimension, shifting laterally in a direction perpendicular to the scan direction so as to position said mask and substrate for another scan partially overlapping with the preceding scan; said stage system thus being capable of exposing the full substrate by breaking up the substrate area into a certain number of parallel strips, and exposing each strip by scanning the length of the strip across a fixed illumination region;
   (b) an illumination system (18) having the wavelength and intensity distribution characteristics suited for exposure of said substrate (10); having an effective source plane in the shape of a regular hexagon; and capable of illuminating a region of said shape on said mask (14);
   (c) a projection assembly (26) for imaging said illuminated region on the mask onto the substrate; having a mask-to-substrate imaging ratio of 1:R; having the desired imaging resolution; and having an image field of an area smaller than the substrate area; and
   (d) control means to operatively interrelate said stage system (12/(15,16)), said illumination system (18) and said projection system (26) to determine the width of said overlap regions of adjacent scans and to provide additive illumination in said overlap regions such that exposures by adjacent scans are compensated in their overlap regions for the nonlinear response characteristics of said substrate (10) so as to provide uniform cumulative response across the entire substrate.

19. A large-area, high-throughput, high-resolution, scan-and-repeat patterning system for uniformly imaging a mask onto a substrate having nonlinear response characteristics, characterized by
   (a) a stage system (12/(15,16)) capable of synchronously moving a mask (14) and a substrate (10) at speeds in a certain ratio 1:R; the movements being scanning in one dimension, and when not scanning in that dimension, shifting laterally in a direction perpendicular to the scan direction so as to position said mask and substrate for another scan partially overlapping with the preceding scan; said stage system thus being capable of exposing the full substrate by breaking up the substrate area into a certain number of parallel strips, and exposing each strip by scanning the length of the strip across a fixed illumination region;
   (b) an illumination system (18) having the wavelength and intensity distribution characteristics suited for exposure of said substrate (10); having an effective source plane in the shape of a regular hexagon (96); capable of illuminating a region of said shape on said mask (14); and having an intensity profile (97,98) in a direction perpendicular to the scan direction tailored to provide compensation for the nonlinear response of the substrate;
   (c) a projection assembly (26) for imagine said illuminated region on the mask onto the substrate; having a mask-to-substrate imaging ratio of 1:R; having the desired imaging resolution; and having an image field of an area smaller than the substrate area; and
   (d) control means to operatively interrelate said stage system (12/(15,16)), said illumination system (18) and said projection system (26) to provide additive illumination in said overlap regions such that exposures by adjacent scans are compensated in their overlap regions for the nonlinear response characteristics of said substrate (10) so as to provide uniform cumulative response across the entire substrate.

20. A large-area, high-throughput, high-resolution, scan-and-repeat patterning system for uniformly imaging a mask onto a substrate having nonlinear response characteristics, characterized by (a) a stage system (12/(15,16)) capable of synchronously moving a mask (14) and a substrate (10) at speeds in a certain ratio 1:R; said movements being scanning in a certain dimension x, and simultaneously scanning in a dimension y which is perpendicular to the dimension x, so as to enable said stage subsystem, while it is completing a scan in the x-dimension, to simultaneously move laterally in the y-dimension so as to position the mask and the substrate for another scan in the x-dimension partially overlapping with the preceding scan in the x-dimension; said stage system thus being capable of exposing the full substrate by breaking up the substrate area into a certain number of parallel strips and exposing each strip by scanning the length of the strip across a fixed illumination region;

(b) an illumination system (18) having the wavelength and intensity distribution characteristics suited for exposure of said substrate (10); having an effective source plane of a predetermined multisided shape (56/67/75); capable of illuminating a region of said shape on said mask (14); said predetermined multisided shape having at least one of its sides curved, and the curvatures of said curved sides being so determined that adjacent scanning exposures in the x-dimension ((65,66)/(73,74)/(84,85)) are compensated in their overlap regions for the nonlinear response characteristics of said substrate (10) so as to provide uniform cumulative response;

(c) a projection assembly (26) for imaging said illuminated region of said predetermined multisided shape on the mask onto the substrate; having a mask-to-substrate imaging ratio of 1:R; having the desired imaging resolution; and having an image field of an area smaller than the substrate area; and (d) control means to operatively interrelate said stage system (12/(15,16)), said illumination system (18) and said projection system (26) to determine the width of said overlap regions of adjacent scans in the x-dimension and to provide additive illumination in said overlap regions such that the effect of the exposure dose delivered in said overlap regions is seamless and the effect of the exposure dose delivered across the entire substrate is uniform.

21. The method of providing a large-area scan-and-repeat pattering system for uniformly exposing substrates with nonlinear response characteristics, characterized by the following steps:

(a) providing a stage system capable of synchronously moving a mask and a substrate at speeds in a certain ratio 1:R, the movements being longitudinal scanning in one direction, and lateral shifting in a direction perpendicular to the scan direction;

(b) determining the nonlinear response characteristics of said substrate by measuring its response values at different values of exposure radiation intensity;

(c) providing an illumination system having the wavelength and intensity distribution characteristics suited for exposure of said substrate; having an effective source plane of a multisided shape; capable of illuminating a region of said shape on said mask; said multisided shape having at least one of its sides curved; and the curvatures of said curved sides being determined by the nonlinear response characteristics of said substrate determined in step (b), in such a way that adjacent overlapping scanning exposures, carried out as described in steps (e) and (f), are compensated in their overlap regions for the nonlinear response characteristics of said substrate so as to provide uniform cumulative response;

(d) providing a projection assembly having an imaging ratio 1:R, capable of producing a 1:R image of said illuminated region of the mask on the substrate, and having an image field size smaller than the size of said substrate;

(e) scanning the mask and substrate longitudinally so that the length of the mask traverses across said multisided illumination region described in step (c);

(f) stopping the stage system momentarily after completion of a scan across the length of the mask, moving the stage system by a certain distance w in a direction perpendicular to the scan direction, and resuming the longitudinal scanning to generate another scan partially overlapping with the preceding scan, the distance w being determined in conjunction with said multisided shape of the effective source plane of said illumination system of step (c) so as provide uniform cumulative response in the overlap region between adjacent scans; and (g) repeating steps (e) and (f) until exposure of the entire substrate is completed.

22. The method of providing a patterning system for uniformly exposing, substrates with nonlinear response characteristics according to claim 21, further characterized by the following steps:

(a) determining the nonlinear response characteristics of multiple substrate materials by inputting the response values of each material at different values of exposure radiation intensity; and (b) providing, in said illumination system, means containing multiple multisided shapes, means for selecting any one of said multiple shapes, and means for producing the effective source plane of the illumination system in said selected shape; each of said shapes being determined by the nonlinear response characteristics determined in step (a) for a different substrate material, in such a way that adjacent overlapping scanning exposures are compensated in their overlap regions for the nonlinear response characteristics of said substrate material so as to provide uniform cumulative response; the illumination system thus being capable of providing optimum nonlinearity--compensation for uniform response in exposure of said different substrate materials having different nonlinearities.

23. The method of providing a large-area scan-and-repeat patterning system for uniformly exposing substrates with nonlinear response characteristics, characterized by the following steps:

(a) providing a stage system capable of synchronously moving a mask and a substrate at speeds in a certain ratio 1:R, the movements being longitudinal scanning in one direction, and lateral shifting in a direction perpendicular to the scan direction;

(b) providing an illumination system having the wavelength and intensity distribution characteristics suited for exposure of said substrate; having an effective source plane in the shape of a regular hexagon; and capable of illuminating a region of said shape on said mask;

(c) providing a projection assembly having an imaging ratio 1:R, capable of producing a ]:R image of said illuminated region of the mask on the substrate, and having an image field size smaller than the size of said substrate;
(d) scanning the mask and substrate longitudinally so that the length of the mask traverses across said hexagonal illumination region described in step (b);
(e) stopping the stage system momentarily after completion of a scan across the length of the mask, moving the stage system by a certain distance w in a direction perpendicular to the scan direction, and resuming the longitudinal scanning to generate another scan partially overlapping with the preceding scan, the distance w being determined in such a way that adjacent scanning exposures are compensated in their overlap regions for the nonlinear response characteristics of said substrate so as to provide optimum uniformity of the cumulative response; and
(f) repeating steps (d) and (e) until exposure of the entire substrate is completed.

24. The method of providing a large-area scan-and-repeat patterning system for uniformly exposing substrates with nonlinear response characteristics, characterized by the following steps:
(a) providing a stage system capable of synchronously moving a mask and a substrate at speeds in a certain ratio 1:R, the movements being longitudinal scanning in one direction, and lateral shifting in a direction perpendicular to the scan direction;
(b) providing an illumination system having the wavelength and intensity distribution characteristics suited for exposure of said substrate; having an effective source plane in the shape of a regular hexagon; capable of illuminating a region of said shape on said mask; and having an intensity profile in a direction perpendicular to the scan direction tailored to provide compensation for the nonlinear response of the substrate;
(c) providing a projection assembly having an imaging ratio 1:R, capable of producing a 1:R image of said illuminated region of the mask on the substrate, and having an image field size smaller than the size of said substrate;
(d) scanning the mask and substrate longitudinally so that the length of the mask traverses across said hexagonal illumination region described in step (b);
(e) stopping the stage system momentarily after completion of a scan across the length of the mask, moving the stage system by a certain distance w in a direction perpendicular to the scan direction, and resuming the longitudinal scanning to generate another scan partially overlapping with the preceding scan, the distance w being determined in conjunction with the intensity profile of said illumination system of step (b) in such a way that adjacent scanning exposures are compensated in their overlap regions for the nonlinear response characteristics of said substrate so as to provide optimum uniformity of the cumulative response; and
(f) repeating steps (d) and (e) until exposure of the entire substrate is completed.

25. The method of providing a large-area scan-and-repeat patterning system for exposing with uniform effect a substrate with a nonlinear response characteristic, such exposure being in a single scanning exposures over non-overlapping parts of the exposed area and in additive pluralities of scanning exposures over overlapping parts, so as to result in a uniform, nonlinearity-compensated response over the entire substrate area, characterized by the following steps:
(a) providing a stage system capable of synchronously moving a mask and a substrate;
(b) providing an illumination system having an effective source plane in the shape of a multisided figure, and capable of illuminating a region of said shape on said mask;
(c) providing an imaging assembly capable of producing an image of said illuminated region of the mask on the substrate, and having an image field size smaller than the size of said substrate;
(d) determining scan adjustment parameters for compensation of said nonlinear response characteristic in exposure of said substrate;
(e) providing means for adjusting scan parameters for said nonlinearity compensation; and
(f) scanning the mask and substrate in a plurality of non-overlapping, and overlapping scans.

26. A large-area, high-throughput, high-resolution, scan-and-repeat patterning system for uniformly imaging a mask onto a substrate, such patterning being by single full exposures of non-overlapping areas of the substrate during full-exposure scans and pluralities of partial exposures of overlapping areas of the substrate during partial exposure scans, characterized by
(a) a radiation-responsive surface, on said substrate, having a nonlinear response to exposure intensity; and
(b) means to vary the intensity of exposure during said pluralities of partial exposure scans to compensate for such nonlinearity of response of said radiation-responsive substrate.

* * * * *